United States Patent [19]

Fraas

[11] 4,451,691
[45] * May 29, 1984

[54] THREE-TERMINAL TERNARY III-V MULTICOLOR SOLAR CELLS AND PROCESS OF FABRICATION

[75] Inventor: Lewis M. Fraas, Albany, Calif.

[73] Assignee: Chevron Research Company, San Francisco, Calif.

[*] Notice: The portion of the term of this patent subsequent to Sep. 13, 1900 has been disclaimed.

[21] Appl. No.: 424,937

[22] Filed: Sep. 27, 1982

Related U.S. Application Data

[63] Continuation-in-part of Ser. No. 352,680, Feb. 26, 1982, Pat. No. 4,404,421.

[51] Int. Cl.³ ............... H01L 31/06; H01L 31/18
[52] U.S. Cl. ................... 136/249; 136/262; 357/30; 148/174; 148/175
[58] Field of Search ............ 136/249 TJ, 262; 357/30; 148/174, 175

[56] References Cited

U.S. PATENT DOCUMENTS 4,387,265  6/1983  Dalal ........................ 136/249

OTHER PUBLICATIONS

S. Sakai et al., "Theoretical Analysis of New Wavelength Division Solar Cells", *J. Appl. Phys.*, vol. 51, pp. 5018-5024 (1980).
G. Guarini, "High Efficiency GaAs Solar Cells for Concentrator & Flat Plate Arrays," 4th European Community Photovoltaic Solar Energy Conference, Stresa, 1982.
Zh. I. Alferov et al., "Two-Element Cascade Al-Ga-As Solar Cell," *Sov. Tech. Phys. Lett.*, vol. 7, pp. 357-358 (1981).

*Primary Examiner*—Aaron Weisstuch
*Attorney, Agent, or Firm*—S. R. LaPaglia; E. J. Keeling; A. Stephen Zavell

[57] ABSTRACT

Three-terminal ternary III-V two-color solar cells incorporating layers of $GaAs_{1-x-y}P_xSb_y$. The three-terminal structure enables the current to be withdrawn from both cells without the necessity of current matching between the two color stacked photovoltaic device. In addition, the three-terminal configuration permits the independent determination of the individual properties of each cell. The stacked two-color cells can be connected in series through the three-terminal arrangement to overcome the problems of independent load matching between the cells encountered with the conventional two-terminal configuration. Finally, the three-terminal two colored solar cells does not require a shorting junction between the homojunction layers of the cells but only a simple transition layer. This speeds the processing of the device.

8 Claims, 5 Drawing Figures

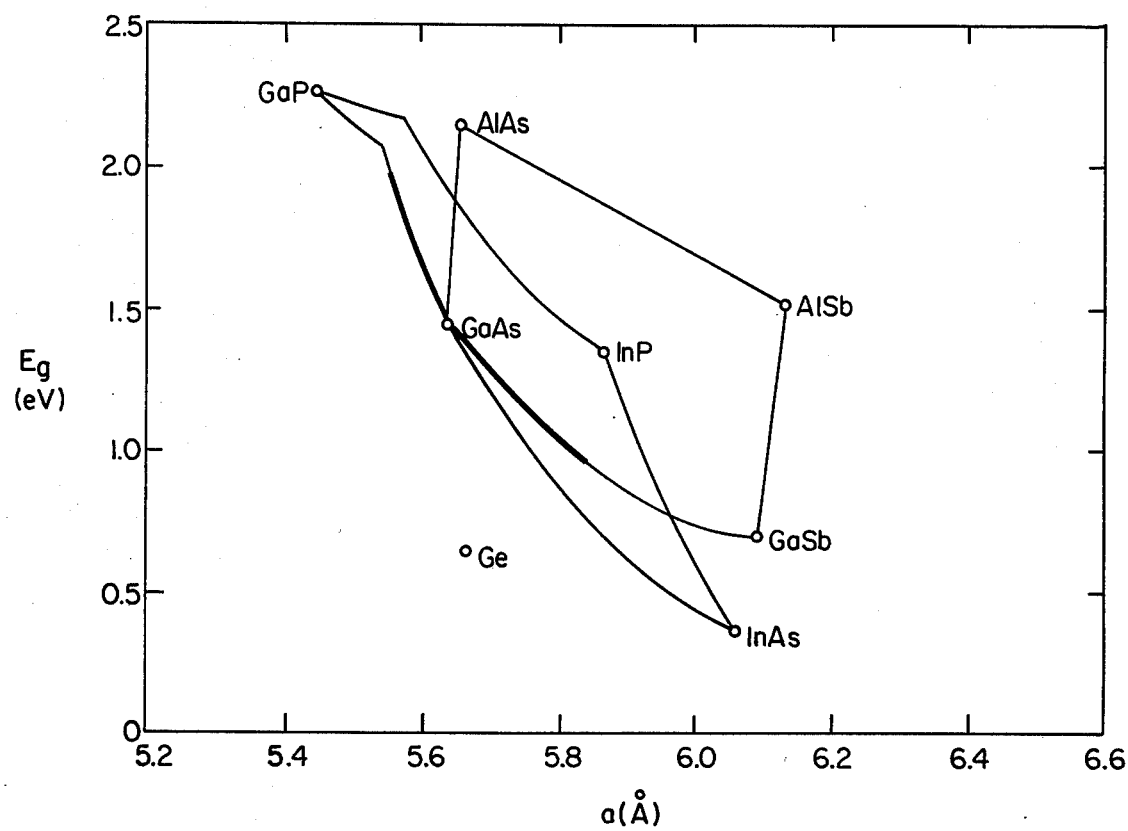
FIG._1.
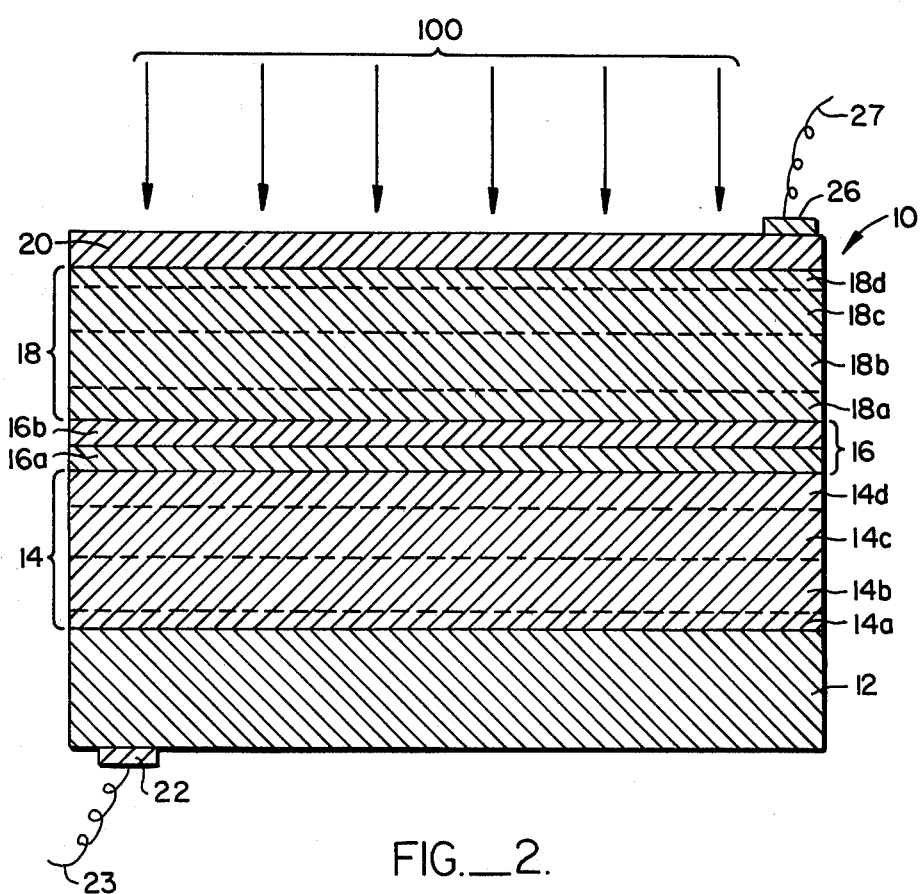
FIG._2.

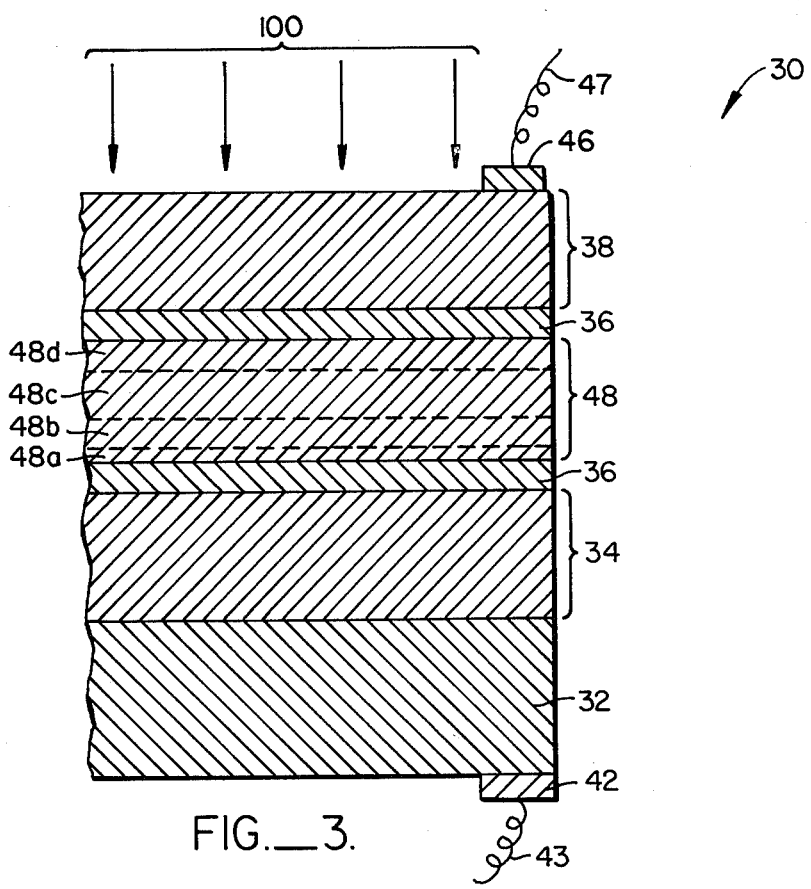
FIG._3.
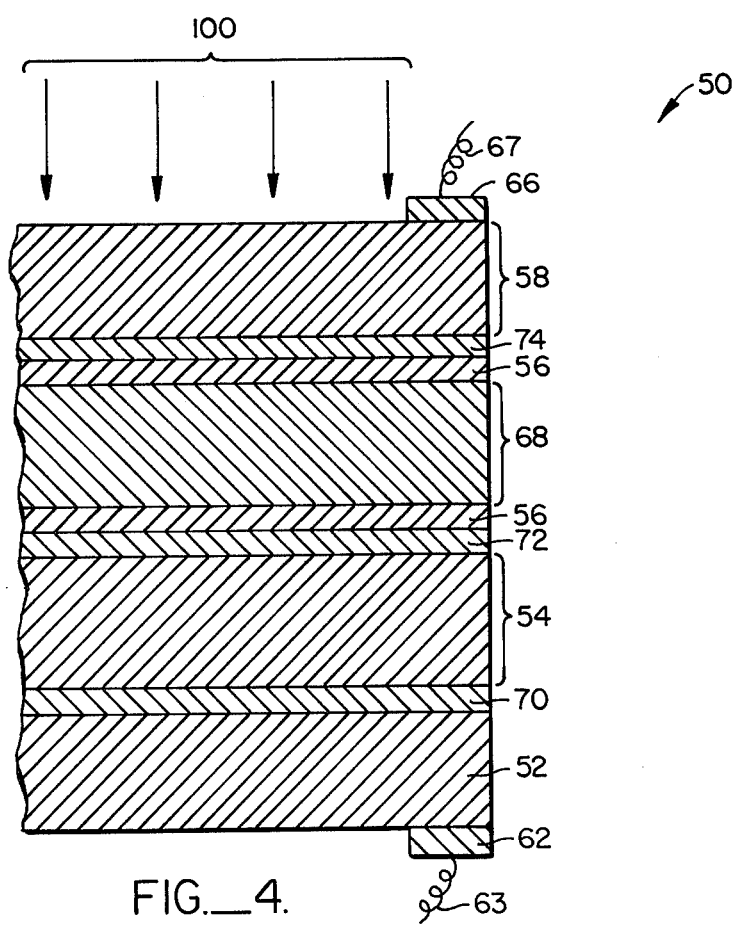
FIG._4.

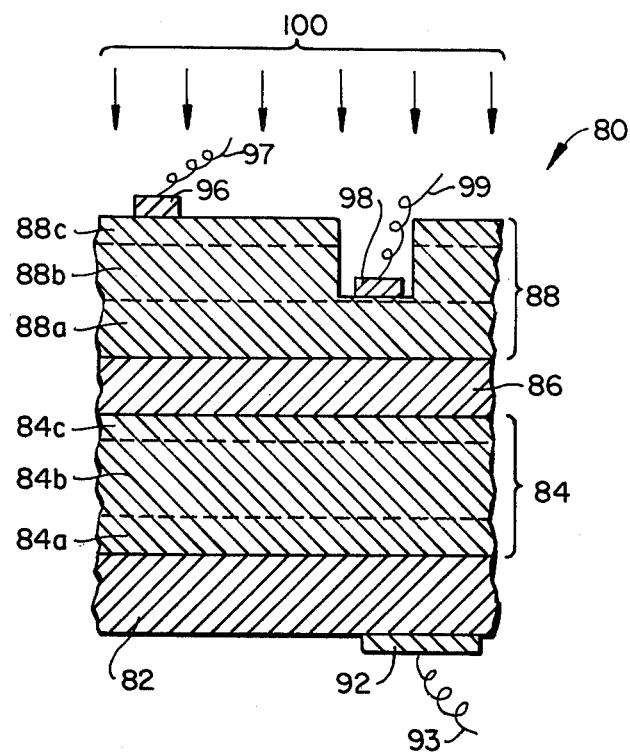
FIG._5.

THREE-TERMINAL TERNARY III-V MULTICOLOR SOLAR CELLS AND PROCESS OF FABRICATION

CROSS-REFERENCE TO RELATED APPLICATIONS

This application is a continuation-in-part of my application entitled "Ternary III-V Multicolor Solar Cells And Process Of Fabrication", filed Feb. 26, 1982 and assigned U.S. Ser. No. 352,680, said application completely incorporated herein by reference, now U.S. Pat. No. 4,404,421.

This invention relates to photovoltaic cells. More specifically, this invention relates to ternary III-V multicolor solar cells.

BACKGROUND OF THE INVENTION

Photovoltaic cells such as silicon or III-V compound solar cells are capable of converting solar radiation into usable electrical energy. The electrical energy conversion occurs as a result of what is well known in the solar cell field as the photovoltaic effect. Solar radiation impinging on a solar cell is absorbed by the semiconductor layer, which generates electrons and holes. The electrons and holes are separated by a built-in electric field, for example, a rectifying junction such as a PN junction in the solar cell. The electrons flow towards the N-type region and the holes flow towards the P-type region. The separation of the electrons and holes across the rectifying junction results in the generation of an electric current known as the photocurrent and an electric voltage known as the photovoltage.

Photovoltaic researchers have been investigating various paths toward the generation of electricity from sunlight on an economic basis which can compete with conventional means of generating electricity. The research has focused mainly on two alternatives for economically making electricity from solar cells. For the first alternative, researchers are trying to make low-cost noncrystalline solar cells, such as amorphous silicon cells, and thereafter deploy the cells as large area flat plate arrays. For the second alternative, researchers use a plastic lens as the large area collector in combination with smaller but higher efficiency solar cells. The lens (or array of lenses) focuses the sunlight onto the small area single crystal solar cell (or array of solar cells).

This invention focuses on improved high efficiency single crystal solar cells for the second alternative although if the materials costs were lowered, the cell could be used in the first alternative. To date, the solar cells with the highest conversion efficiencies have been fabricated from the III-V compound semiconductor material, GaAs.

Multicolor solar cells, i.e., cells which absorb light at two or more wavelengths in two or more materials, promise still higher conversion efficiencies. Multicolor solar cells have been described in various U.S. patents such as Nos. 4,017,332; 4,179,702; and 4,128,733; and in various technical publications such as the *Fifteenth IEEE Photovoltaic Specialists Conference*, 1981, pp. 1289-1293.

Multicolor solar cells are formed from various semiconductors each containing a light sensitive junction and each semiconductor material is sensitive to a different portion of the solar spectrum. The simplest, lowest cost multicolor cell is formed by growing these various layers in succession as a stack of single crystal films on a single crystal wafer.

Devices have been fabricated with $Al_{1-x}Ga_xAs_ySb_{1-y}$, $Al_{1-x-y}Ga_xIn_yAs$, or $Ga_{1-x}In_xAs_yP_{1-y}$ material systems employing vertical lattice matching with, for example, $GaAs_{1-x}Sb_x$, $Ga_{1-x}In_xAs$, and $Al_{1-x}Ga_xAs_{1-y}Sb_y$, $Ga_{1-x}In_xP$, respectively.

The growth systems used to fabricate these devices have employed rapid layer growth via liquid phase epitaxy systems (LPE) or metal organic chemical vapor deposition systems (CVD) operating at 1 atmosphere total pressure.

The Al containing compounds exhibit stability problems when exposed to ambient conditions. Al has an affinity for oxygen and carbon incorporation. This makes oxygen and carbon impurity incorporation a problem during film growth and it makes the final devices less stable in outdoor deployment in moist air.

Growth of the $Ga_{1-x}In_xAs_{1-y}P_y$ compound by metal organic CVD has experienced chemical problems resulting from the indium metal organic transport agent, triethyl indium (TEIn). One problem is that TEIn has a very low vapor pressure, making it difficult to supply to the growth zone. A second problem with TEIn is that it reacts prematurely at room temperature with $AsH_3$ and $PH_3$. The resultant compound, formed by alkane elimination, is not volatile. These problems make it difficult to work with the GaInAsP system.

U.S. Pat. No. 4,278,474 describes using Si, GaAsP and GaAs/GaAsP superlattices. However, this system suffers from two problems. First, large lattice mismatch, and second, very large terminal expansion coefficient mismatch. The lattice mismatch is about 4%. Superlattices have been fabricated to solve the first problem. However, the problem of thermal mismatch is more difficult to solve. The GaAsP layer grown on Si is in thermal equilibrium at the growth temperature; when cooled, it shrinks much more than does the silicon substrate. The result is a cracked GaAsP layer which ruins the solar cell.

Thus, it would be highly desirable to have a ternary III-V compound semiconductor material system which does not contain elements which cause the fabricated layer to react with ambient weather conditions which shorten the lifetime of the photovoltaic device, e.g., $Al_{1-x}Ga_xAs$. Furthermore, it would be desirable to have ternary or quaternary III-V layers which lattice match to within ±1% and do not require superlattices, e.g., U.S. Pat. No. 4,278,474, to avoid the mismatching of the active layers of a multicolor photovoltaic cell. In addition, it would be a desirable option to have a multicolor cell which can incorporate very thin transition layers to avoid or reduce the mismatch between the active layers. It would also be desirable to have a multicolor cell which was not restricted to selecting materials that lattice match only a single lattice constant wherein the layer's composition is fixed by the need to grow vertically up a material system from a III-V compound alloying on the V side, e.g., $GaAs_{1-x}Sb_x$, to a III-V compound alloying on the III and V sides, e.g., $Al_{1-x}Ga_xAs_{1-y}Sb_y$. It would also be desirable to have a growth process which permits the multiple layers to be fabricated at lower temperatures of about 500° C. to about 650° C. and at lower growth rates of about from 1 μm/m to about 10 μm/m than are required by LPE. It would also be desirable to have a multicolor cell system wherein the layers are alloyed on the V side and with V compounds which can be supplied in excess, because of their volatility, without affecting the semiconductor layer. It would be desirable to avoid a layer fabricated from materials, e.g., triethyl indium (TEIn) which prematurely react with the other compounds, e.g., AsH$_3$ and PH$_3$, needed to form the semiconductor layer.

SUMMARY OF THE INVENTION

These and other desirable properties are incorporated into my multicolor solar cell and process of fabrication invention. The invention utilizes the GaAs$_{1-x-y}$Sb$_y$P$_x$ semiconductor alloys. The alloys have bandgap energies which are responsive to solar radiation in the range of from about 1.3 to about 0.35 microns ($\mu$m).

Two- and three-color cells can be fabricated. The two-color cell comprises homojunction layers of GaAs$_{1-y}$Sb$_y$ for the low bandgap cell and GaAs$_{1-x}$P$_x$ for the high bandgap cell. The cells can be fabricated on GaAs or Ge substrates. Shorting junctions separate the GaAs$_{1-x}$P$_x$ and GaAs$_{1-y}$Sb$_y$ cells. Suitable shorting junctions can be fabricated with layers of GaAs or Ge of from about 0.0075 micron, i.e., 75 Å, to about 0.1 micron thick. The two-color cells can be fabricated with two or three terminals contacting the active layers.

Three-color cells are fabricated with GaAs$_{1-y}$Sb$_y$ for the low bandgap, GaAs for the mid bandgap, and GaAs$_{1-x}$P$_x$ for the high bandgap cells. Each homojunction layer is separated by a shorting junction. This construction limits lattice mismatch at each stage between layers to about ±1%. The light sensitive junctions are within the layers and thus removed from mismatch interfaces. In a preferred embodiment, the mismatch is further reduced by adding a transition layer of about 0.02 $\mu$m thick of an intermediate composition alloy at each interface between the active layers of the multicolor cell. For example, the mismatch between layers in a three-color cell is reduced to about ±0.5% if a layer of GaAs$_{0.9}$Sb$_{0.1}$ is fabricated between the GaAs cell and the low bandgap cell having a composition of GaAs$_{0.8}$Sb$_{0.2}$ or between the GaAs substrate and the low bandgap cell. Similarly, a layer of GaAs$_{0.9}$P$_{0.1}$ between the high bandgap cell having a composition of GaAs$_{0.8}$P$_{0.2}$ and the middle bandgap gaAs cell reduces the mismatch. The transition layers do not contain light sensitive junctions.

BRIEF DESCRIPTION OF THE DRAWINGS

FIG. 1 illustrates the GaAs$_{1-x-y}$Sb$_y$P$_x$ semiconductor alloys.

FIG. 2 illustrates a cross-sectional view of a two-color III-V compound photovoltaic cell incorporating light sensitive homojunction layers of GaAs$_{1-y}$Sb$_y$ and GaAs$_{1-x}$P$_x$.

FIG. 3 illustrates a partial cross-sectional view of a three-color III-V compound photovoltaic cell incorporating light sensitive homojunction layers of GaAs$_{1-y}$Sb$_y$, GaAs, and GaAs$_{1-x}$P$_x$.

FIG. 4 illustrates a partial cross-sectional view of a three-color III-V compound photovoltaic cell as in FIG. 3 further incorporating transition layers between the active homojunction layers.

FIG. 5 illustrates a partial cross-sectional view of a three-terminal two-color III-V compound photovoltaic cell incorporating light sensitive homojunction layers of GaAs$_{1-y}$Sb$_y$ and GaAs$_{1-x}$P$_x$.

DETAILED DESCRIPTION OF THE INVENTION

FIG. 1 illustrates the GaAs$_{1-x-y}$Sb$_y$P$_x$ semiconductor alloys described herein. Plotted is the lattice constant vs. bandgap energy for III-V and semiconductor alloys and germanium (group IV). The GaAs$_{1-x-y}$Sb$_y$P$_x$ alloys are highlighted by the heavy solid line. For x and y ≦ 0.4, the bandgap energies of the semiconductor alloys span the range from about 0.95 eV to about 1.9 eV. The breadth of the possible bandgap energies makes these semiconductor alloys ideally suited for fabricating two- and three-color concentrator solar cells. Whereas previous researchers have picked compounds which span the energy range vertically (y axis) with constant lattice constant (x axis), irrespective of the compound chemistry, my invention spans the same range while allowing small lattice constant changes per step and small chemical changes on the Group V site per step. This facilitates the fabrication of the multicolor cells.

A two-color solar cell incorporating my invention is illustrated as solar cell 10 in FIG. 2. Solar radiation 100 serves as a reference point for the top and bottom of each layer or region. Solar cell 10 has a substrate 12 of germanium, gallium arsenide or other suitable material. The substrate can be either N-type or P-type conductivity. If the substrate is N-type conductivity, then the homojunction layers are NP junctions. Alternatively and for FIGS. 3 and 4 as well, the substrate can be of P-type conductivity and the homojunction layers can be PN junctions. The substrate 12 can be of P$^+$-type conductivity having a dopant concentration on the order of 1×10$^{18}$ dopant atoms per cubic centimeter (Da/cc) with a suitable P-type conductivity modifier such as zinc, cadmium, magnesium, and the like.

A first homojunction layer 14 of GaAs$_{1-y}$Sb$_y$ is fabricated on substrate 12. The GaAs$_1$−ySb$_y$ layer is lattice matched to the substrate to within about ±1%. I have discovered that when using vacuum metal organic-chemical vapor deposition (MO-CVD), lattice mismatching of up to about ±1% can be tolerated without seriously affecting the overall performance of the solar cell, although as close a lattice match as possible to the lattice constant of the substrate is preferred.

The GaAs$_{1-y}$Sb$_y$ layer 14 has the y value adjusted according to the solar spectrum to maximize energy conversion and to provide a bandgap which is less than the bandgap of any higher bandgap layers such as the top homojunction semiconductor layer 18. Normally, the GaAs$_{1-y}$Sb$_y$ layer is selected to have its major absorptance towards the IR range of the spectrum while the top layer 18 is selected to have an absorptance in the visible and ultraviolet range of the solar spectrum. y can vary from about 0.08 to about 0.4 and preferably from about 0.2 to about 0.3. For example, a GaAs$_{1-y}$Sb$_y$ layer, wherein y is 0.2, i.e., a layer of GaAs$_{0.8}$Sb$_{0.2}$, has a bandgap energy of about 1.1 electron volts (eV) and is suitable as the low band homojunction layer.

Layer 14 is from about 2.5 $\mu$m to about 3.5 $\mu$m thick and has regions of different conductivity 14a, 14b, 14c, and 14d which form a homo PN junction therein. The first region 14a of P$^+$-type conductivity has a dopant concentration of about 6×10$^{18}$ Da/cc and a thickness of about 0.1 to 0.3 $\mu$m. The second region 14b of layer 14, has P-type conductivity with a dopant concentration of about 3×10$^{17}$ Da/cc and a thickness of about 2 to 2.5 $\mu$m. Region 14b forms a homojunction with the third region 14c of N-type conductivity. Region 14c has a dopant concentration of about $1 \times 10^{18}$ Da/cc N-type dopant atoms and a thickness of about 0.2 to 0.7 μm. Suitable N-type dopant atoms are selenium, tellurium, or sulfur, and the like. Region 14c is graded to N+-type conductivity in a region 14d. The dopant concentration of region 14d is about $1 \times 10^{19}$ Da/cc and has a thickness of about 0.04 to 0.08 μm. Region 14d contacts a shorting junction 16 which separates the higher bandgap homojunction layer 18 from the layer 14.

The shorting junction 16 can be a germanium layer doped N+-type conductivity as taught in my U.S. Pat. No. 4,255,211, incorporated herein by reference, or a layer 16 of a material such as GaAs having a region 16a of GaAs doped N+-type conductivity and contacting layer 14, with a second region 16b of GaAs doped P+-type. A tunnel junction in layer 16 permits the transport of electrons between semiconductor layer 14 and semiconductor layer 18 without the formation of a counter PN junction between region 14d and region 18a which would lower the performance of the overall device 10. The GaAs N+/P+-type shorting junction 16 will be on the order of about 400 Å thick. If N+-type or P+-type germanium is selected as the shorting junction 16, the layer is only about 0.0050 to about 0.0075 μm thick.

Contacting shorting junction 16 and lattice matching thereto to within about ±1% is a layer 18 of a material having a higher bandgap than the layer 14 such as gallium arsenide phosphide ($GaAs_{(1-x)}P_x$) having regions of differing conductivity 18a, 18b, 18c, and 18d. The x value can be from about 0.1 to about 0.3 and preferably about 0.2 for the bandgap energy of about 1.65 eV. Gallium arsenide phosphide is a preferred top layer because it is not affected by ambient weather conditions. This is in contrast to gallium aluminum arsenide, which is susceptible to degradation from moist air. In addition, the Group V compounds used to form the layers tend to volatilize and not cause problems with inclusion of second phase defects. Thus, the flow rate of the organometallics does not have to be monitored with extreme precision during the fabrication process.

Region 18a of P+-type conductivity is about 0.1 to 0.3 μm, and preferably about 0.2 μm thick and incorporates P-type conductivity modifiers recited previously in a concentration of about $6 \times 10^{18}$ Da/cc. Region 18b of P-type conductivity is about 2 to 3 μm, preferably about 2.2 μm thick, and has a P-type dopant concentration of about $3 \times 10^{17}$ Da/cc. Forming the PN junction with region 18b is region 18c of N-type conductivity, incorporating N-type conductivity modifiers recited previously in a doping concentration of about $1 \times 10^{18}$ Da/cc. Region 18c is about 0.2 to 0.7 μm and preferably about 0.5 μm thick. Finally, semiconductor layer 18 has a region 18d of N+-type conductivity about 0.1 μm thick with a dopant concentration of about $1 \times 10^{19}$ Da/cc.

Optionally, a passivation layer 20 of any material suitable to reduce the surface recombination velocity of the device contacts layer 18. An example of a suitable passivation layer is a gallium arsenide phosphide layer wherein x is increased slightly above its value in the layer 18. For example, if layer 18 is $GaAs_{0.8}P_{0.2}$, then layer 20 would be greater than that or about $GaAs_{0.75}P_{0.25}$. The passivation layer 20 is about 0.01 to about 0.3 μm, and preferably 0.02 μm thick.

The multijunction solar cell 10 is completed with electrical contacts 22 to substrate 12 and 26 to layer 20, respectively. Wires 25 and 27 withdraw the electrical current generated during illumination of the solar cell with solar radiation 100. The electrical contacts 22 and 26 can either be a single uniform metal layer or a grid electrode. In addition, the cell is normally used with a concentrating lens as illustrated in U.S. Pat. No. 4,255,211. Optionally, the solar cell can also include antireflection coatings and the like.

FIG. 3 illustrates a three-color solar cell 30. The substrate 32 corresponds to the substrate 12 in FIG. 2. Layer 34 is the same as layer 14 in FIG. 1. Layer 38 corresponds to layer 18 of FIG. 1; however, the bandgap of the layer 38 is adjusted to about 1.8 eV by setting x equal to about 0.3. Layers 36 correspond to layer 16 in FIG. 1.

Solar cell 30 further incorporates homojunction GaAs layers 48 separated from layers 34 and 38 by shorting junction layers 36. The layer 48 has a bandgap energy of about 1.45 eV and a thickness of from about 2.5 to about 3.5 μm, and preferably about 3 μm. The layer 48 has regions 48a, 48b, 48c and 48d of P+-type, P-type, N-type and N+-type conductivity, respectively. The regions have comparable thicknesses to layers 34 and 38.

FIG. 4 illustrates a three-color solar cell 50 which further incorporates transition layers 70, 72, and 74. Layers 52, 54, 56, and 58 are the same as layers 32, 34, 36, and 38 of FIG. 3. Layer 68 corresponds to layer 48. Contacts and wires 62, 63, 66, and 67 correspond to 42, 43, 46, and 47 of FIG. 3. Layers 70 and 72 are $GaAs_{1-y}Sb_y$ wherein y is less than y in the layer 54 for layers 70 and layer 72. For example, if layer 54 is $GaAs_{0.8}Sb_{0.2}$, then layers 70 and 72 are of $GaAs_{0.9}Sb_{0.1}$. The layers 70 and 72 are about 0.02 μm thick. Layers 70 and 72 are P+-type and N+-type conductivity, respectively. Layer 74 is $GaAs_{1-x}P_x$ wherein x is of a lesser value than in layer 58. For example, if layer 58 is $GaAs_{0.8}P_{0.2}$, then layer 74 is $GaAs_{0.9}P_{0.1}$. Layer 74 is about 0.02 μm thick and has a P+-type conductivity. The exact-compositions of layers 70, 72, and 74 are adjusted to minimize defects as the compositions change from $GaAs_{1-y}Sb_y$ through GaAs to $GaAs_{1-x}P_x$.

FIG. 5 illustrates a partial cross-sectional view of a three-terminal two-color solar cell 80. Solar radiation 100 serves as a reference point for the top and bottom of each layer or region. Solar cell 80 has a substrate 82 of germanium or preferably gallium arsenide. The substrate can be either N-type or P-type conductivity. With a P-type substrate 82, a PNP solar cell is fabricated. With an N-type substrate 82, an NPN solar cell is fabricated. PNP solar cells and NPN solar cells can be connected together in series to overcome the problems of independent load matching as taught by Sakai et al., *J. Appl. Phys.*, 51(9), pp. 5018–5024 (1980), incorporated herein by reference. For the purposes of this illustration, the substrate 82 is GaAs doped to an N+-type conductivity and therefore, solar cell 80 is an NPN solar cell. The first homojunction layer 84 of $GaAs_{1-y}Sb_y$ is fabricated on the substrate 82. Y has the same possible values as the y values in the two-color solar cell 10.

The layer 84 has regions of N+-type conductivity 84a, N-type conductivity 84b, and P+-type conductivity 84c. The regions are doped with suitable N-type and P-type dopants and concentrations mentioned previously. The N+-type region 84a is from about 0.5 to about 1.5 μm thick and preferably about 1 μm thick. The N-type region 84b is from about 1.5 to about 3.0 μm thick and preferably about 2.0 μm thick. The P+-type region 84c is from about 0.1 to about 0.3 μm thick and preferably about 0.2 μm thick. The NP+ homojunction in the layer 84 forms between the regions 84b and 84c.

Fabricated on the layer 84 of GaAs$_{1-y}$Sb$_y$ is a transition layer 86 of the P+-type GaAs. A three-terminal solar cell does not require a shorting junction between the homojunctions but only a simple transition 86. The layer 86 has a thickness of from about 0.05 to about 0.15 μm and preferably about 0.1 μm.

An incident homojunction layer 88 of GaAs$_{1-x}$P$_x$ is fabricated on the transition layer 86. The layer 88 has the same possible values of x as in the two-color cell illustrated in FIG. 2. The layer 88 has regions 88a, 88b and 88c of P+-type conductivity, P-type conductivity and N+-type conductivity, respectively. The homojunction of layer 88 forms between regions 88b and 88c. Region 88a has a thickness of from about 2.0 to about 4.0 μm and preferably about 3.0 μm. Region 88b has a thickness of from about 1.5 to about 3.0 μm and preferably about 2.0 μm. Region 88c has a thickness of from about 0.05 to about 0.3 μm and preferably about 0.1 μm.

The solar cell 80 is completed with electrical contacts 92, 96 and 98. Contacts 92 and 96 should be fabricated from materials which ohmically contact N-type materials such as Au:Ge, Ag:Sn, and the like. Contact 98 should ohmically contact the P-type region 88b. The depth of electrode 98 below the incident surface is on the order of from about 3.0 to about 4.0 μm deep. Standard photolithography and etching solutions are used to place electrode 98 into region 88b. Suitable materials are Au:Zn, Au:Be, Ag:Mn, and the like. Wires 93, 97 and 99 withdraw the current generated by the solar cell 80 under illumination with solar radiation 100.

The electrodes 96 and 98 are spaced apart so as to maintain the sheet resistance losses less than or equal to the contact resistance. Therefore, the lower the contact resistance, the farther apart the grid spacings can be fabricated. Suitable electrode spacings for a grid electrode are from about 150 μm to about 400 μm with an electrode width of about 15 μm. Grid shading loss can be reduced by using a grooved cover glass as taught by P. Borden, *Sandia Laboratories Technical Report*, SAND-81-1240, p. 209 (June 1981), incorporated herein by reference. Optionally, solar cell 80 can have passivation layers or antireflection coatings, not shown, on the incident surface of region 88c.

Fabricating the multicolor solar cells 10, 30 and 50 from the GaAs$_{1-x-y}$Sb$_y$P$_x$ alloys has many additional processing benefits which are not obvious from the structures. For example, the commercially available metal organics which incorporate antimony have vapor pressures which are orders of magnitude higher than the metal organics incorporating indium. More specifically, triethyl indium (TEIn) has a vapor pressure of about 0.2 torr, whereas trimethyl antimony (TMSb) has a vapor pressure of about 110 torr. The higher vapor pressure facilitates the introduction of Sb into the growth zone. In addition, the increased volatility of the elements of Column V (i.e., Sb and P) of the Periodic Chart over Column III elements (i.e., Al or In), reduces the possibility of droplets or other deposits of the metal forming on the film as it grows and thus reduces or eliminates inclusions or other damage to the crystalline structure of the layers. Furthermore, indium compounds of metal organics of Column III tend to undergo alkane elimination reactions with arsine at room tempeerature. This means that more of the materials must be used to grow a given layer and also increases the possibility of contamination of the layer. The method employed by my invention is also more streamlined because all the layers of the solar cell contain gallium and arsenic and hence more uniform films can be grown because fewer gases must be changed during the growth process. With the multijunction cells of my invention, the metal organics of antimony or other Group V materials or phosphorus compounds can be changed by in situ gas sequencing to grow a multicolor, multijunction solar cell. This lowers the cost and shortens the processing time of the solar cell fabricated in comparison to alternate growth systems which require a termination of the growth process after each layer with a cooling of the substrate, exposure to the atmosphere and transportation to a second or third growth chamber for processing of the subsequent layers.

The cell can be fabricated by the process taught in U.S. Pat. No. 4,171,235, incorporated herein by reference or by U.S. Pat. No. 4,290,385, incorporated herein by reference. More specifically, a substrate is placed in a chemical vapor deposition apparatus and the chamber is evacuated to a pressure of from about $1 \times 10^{-6}$ torr to about $1 \times 10^{-8}$ torr and preferably about $10^{-7}$ torr. The substrate is heated to a temperature of from about 500° C. to about 650° C. and preferably about 560° C. Thereafter, sources of gallium, arsenic and antimony are opened to a flow rate of about 1 scc/min., 3 scc/min. and 3 scc/min., respectively, for each of said sources. scc/min. is an abbreviation for a standard cubic centimeter per minute and is defined as the amount of gas occupying one cubic centimeter of volume at standard conditions (1 atm, 20° C.) flowing past a point in one minute. A dopant source such as diethyl zinc enters the chamber at a flow rate of about 0.3 scc/min. to create the initial P+ layer and thereafter is slowed to about 0.01 scc/min. to create the P-type region. After growth of the P-type region, the P-type dopant source is turned off and an N-type dopant source is turned on and adjusted to an appropriate flow rate, for example, about 0.1 scc/min., to grow the N-type region of the layer, followed by an increased flow rate, for example, about 0.3 scc/min., for about 1 minute to create an N+ region. A shorting junction of germanium or other suitable material is grown on top of the GaAs$_{1-y}$Sb$_y$ layer by turning off the gallium, arsenic and antimony sources and passing a source of germanium over layer 14 for about 3 minutes at a flow rate of about 5 scc/min. Finally, a top layer of semiconductor material having a larger bandgap than layer 14 such as GaAs$_{1-x}$P$_x$ is fabricated by methods analogous to that used to fabricate layer 14 or as taught in U.S. Pat. Nos. 4,255,211; and 4,332,974, said patents being incorporated herein by reference. In a three-color cell, the GaAs layer can be fabricated in a comparable procedure.

Preferably, the shorting junction layer and the top layer are fabricated from materials that can also contain gallium and arsenic so that a more uniform process can be effected with only the need to adjust the flow rate of the arsenic, the third element of the ternary compound, to create the larger bandgap top layer 18 and the shorting junction 16. With a GaAs shorting junction, the Ga source can be set at a constant flow rate and only the flow rates of the As and other V elements need be varied to grow the two-color cell. The three-color cell is fabricated by growing a middle homojunction layer of GaAs. Of course, the x and y values can be adjusted by adjusting the flow rates of the compounds containing the elements to obtain any desired bandgap energy of the laayers between about 0.90 eV and 1.95 eV.

The three-terminal two-color cell is fabricated in a similar procedure to the steps outlined for two-color and three-color cells. However, the third electrode is formed by standard photolithographic techniques using photmasks and photoresists; exposing the photoresist and developing same and thereafter etching the GaAsP with standard etchants to form the well for the electrode.

The invention will be more specifically described by referring to the following examples. However, it is understood that the invention is not intended to be limited in any way by the following specific example. Modifications which would be obvious to the ordinary skilled artisan, such as fabricating the soloar cell with only PN regions for each layer or reversing the junctions to the NP configuration, and the like, are contemplated to be within the scope of the invention. The fabrication could also be accomplished with CVD or LPE, and the like.

EXAMPLES

Example 1

A GaAs P-type wafer about 250 μm thick was used with a (100) orientation [2° off toward (110)]. The wafer was mounted on a molybdenum block with indium:zinc alloy solder. The wafer was then polished and lightly etched with a bromine methanol solution, and loaded into the vacuum MO-CVD machine. The air was pumped out to form a vacuum of $2 \times 10^{-7}$ torr and resistive substrate heaters were turned on. When the substrate temperature reached 560° C. and the chamber pressure dropped below $5 \times 10^{-7}$ torr, the wafer was left for 10 minutes to desorb and oxide. Thereafter, a 50:50 $AsH_3:H_2$ gas mixture flow was turned on and set at 10 scc/min. Thereafter, the triethyl gallium (TEGa) and diethyl zinc (DEZn) flows were started simultaneously, thereby starting the growth of a P+ GaAs buffer layer about 1000 Å thick. This layer buried any remaining substrate surface contaminants. The TEGa flow was 1 scc/min. and the DEZn flow was 0.3 scc/min. During the growth of the GaAs layer, the substrate temperature was decreased to about 540° C. After 3 minutes, the trimethyl antimony (TMSb) flow was started. The flow rate was pre-set to 3 scc/min. The $AsH_3:H_2$ flow was cut back to 7 scc/min. and the P+ $GaAs_{0.88}Sb_{0.12}$ layer was grown in about 3 minutes.

Thereafter, the DEZn flow was stopped. The residual zinc in the system doped the growing layer P-type. The P region was grown in 90 minutes to a thickness of about 3 μm thick. Then the $H_2Se$ flow was started. The $H_2Se$ was purchased premixed with $H_2$ to 0.5% $H_2Se$ from Scientific Gas Products Company. The $H_2$ with 0.5% $H_2Se$ flow was set at 1% of the $AsH_3:H_2$ flow rate. The N+-type GaAsSb layer was grown in 10 minutes. Then the $AsH_3:H_2$ flow was increased to 10 scc/min. and the TMSb flow was stopped. The growing layer was N+-type GaAs. The substrate temperature was increased to about 560° C. After 1 minute, the TEGa flow was stopped. After 1 more minute, the $H_2Se$ flow was stopped. After 1 more minute delay, the TEGa and DEZn flows were started simultaneously at their previous flow rates. The growing layer was P+-type GaAs. After 3 minutes, the 50:50 $PH_3:H_2$ gas mixture flow was started, having been pre-set to 7 scc/min. The $AsH_3:H_2$ flow was cut back to 5 scc/min. The growing layer was P+-type $GaAs_{(0.82)}P_{(0.18)}$. After 3 minutes, the DEZn flow was stopped and a P-type layer was grown for 90 minutes.

To grow the N+-type $GaAs_{(0.82)}P_{(0.18)}$ layer, the $H_2:H_2Se$ flow was turned on at its prior setting. The N+-type layer was grown for 10 minutes. To end the semiconductor layer growths, the TEGa was turned off, followed by $PH_3$, $H_2Se$, $AsH_3$ and then finally the heaters were turned off. When the wafers had cooled down to room temperature, they were unloaded and grids and antireflection coatings were deposited. The voltages of the stacked layers were additive and the cell had a $V_{oc}$ of about 1.6 V at a $J_{sc}$ of about 5 milliamps. The voltage at 100 suns equivalent current was about 1.8 V. The uncalibrated spectral response for the cell showed two peaks at 1 μm and 0.77 μm. The peaks were attributable to GaAsSb and GaAsP layers, respectively.

EXAMPLE 2

A three-color solar cell was fabricated in accordance with the procedures outlined in Example 1; however, a middle bandgap GaAs layer, set off from the low and high bandgap layers by shorting junctions, was grown between the $GaAs_{1-y}Sb_y$ and $GaAs_{1-x}P_x$ layers. The TEGa flow rate was the same and the $AsH_3:H_2$ flow rate was increased to about 10 cc/min. for the growth of the GaAs layer. The doping was carried out as in Example 1. The voltages of the stacked layers were additive and the three-color cell had a $V_{oc}$ of about 2.8 V at a $J_{sc}$ of about 5 milliamps (ma). The uncalibrated spectral response for the cell showed three peaks at 0.96 μm, 0.86 μm, and 0.78 μm, which were attributable to GaAsSb, GaAs, and GaAsP layers, respectively.

Example 3

An N-type GaAs wafer doped with Te to $2 \times 10^{18}$ atoms/cm$^3$ was purchased from Crystal Specialties. The wafer was oriented 2° off the 100 facet toward the 110 direction and was received as cut without polishing. The wafer was scribed and cut so that several square (1.1 cm × 1.1 cm) substrates were obtained. The substrates were mounted on molybdenum blocks with indium solder and polished by known methods such as with a Br-methanol solution as described in *J. Appl. Phys.*, 52, p. 6939 (1981), incorporated herein by reference.

Thereafter, a GaAs substrate was given a brief Br-methanol etch to remove surface contaminants just before loading into a vacuum metal-organic chemical vapor deposition (MO-CVD) machine for the epitaxial layer growths. The MO-CVD equipment has been described previously in the previous article and Fraas, *SPIE Conf. Proc.*, (Jan. 27, 1982), incorporated herein by reference. The gas or vapor sources for Ga, Zn, Sb, As, P, and Se were pure triethyl-Ga (TEGa) (Alfa Ventron), pure diethyl-Zn (DEZn) (Alfa-Ventron), pure trimethyl-Sb (TMSb) (Alfa-Ventron), 50% arsine-balance hydrogen (Phoenix), 50% phosphine-balance hydrogen (Phoenix), and 500 ppm hydrogen selenide-balance hydrogen (Scientific Gas Products), respectively. After substrate loading, the deposition chamber was evacuated to $10^{-7}$ torr and the substrate heaters were turned on. The substrate temperature was raised to 600° C. for 15 minutes to flash off oxides. The substrate temperature was then reduced to the growth temperature of 550° C. and the arsine flow started. First, the N+-type $GaAs_{(1-y)}Sb_{(y)}$ layer wherein y is about 0.08 was grown with an arsine flow of 11.6 sccm, a TEGa flow control pressure of 0.42 torr, a TMSb control pressure of 0.8 torr and an H$_2$Se flow of 2 sccm. The growth time was 30 minutes (0.75 μm). Then, the N-type GaAs$_{(1-y)}$Sb$_{(y)}$ layer was grown by decreasing the H$_2$Se flow to 0.5 sccm (1 hour for 1.5 μm). Thereafter, the H$_2$Se flow was turned off and the growth was continued for 45 minutes to grow a 1 μm GaAs$_{(1-y)}$Sb$_{(y)}$ n-type layer. Then a P-type GaAs$_{(1-y)}$Sb$_{(y)}$ layer was grown by turning on the DEZn flow to a control pressure of 2 torr (15 minutes for 0.25 μm). Then a P$^+$-type GaAs$_{(1-y)}$Sb$_{(y)}$ layer was grown for 15 minutes with a DEZn control pressure of 6 torr. The growth of the GaAsSb cell layers was terminated by turning off the TMSb flow. The TEGa, AsH$_3$, and DEZn flows were left on for the growth of a P$^+$-type GaAs transition layer (DEZn control pressure 10 torr, 10 minutes). Then the GaAs$_{(1-x)}$P$_{(x)}$ layer wherein x is about 0.18 growth was begun by turning on the PH$_3$ flow. The AsH$_3$ flow was adjusted down to 4.5 sccm and the PH$_3$ flow was set at 7 sccm. A P$^+$-type GaAsP layer was grown for 30 minutes (0.75 μm) with a DEZn control pressure of 6 torr. Then the P-type GaAsP layer was grown for 1.5 hours with DEZn control pressure of 2 torr. The DEZn flow was then turned off and the growth of the GaAsP P-type layer was continued for 1 hour. The top cell was then terminated with an N$^+$-type GaAsP layer by turning on the H$_2$Se flow to 5 sccm for 20 minutes. Then all gas flows were terminated and the heaters turned off terminating the semiconductor layer fabrication. It is noteworthy that the TEGa and AsH$_3$ gases were flowing without interruption throughout the above deposition sequence and that all the gas flows are microprocessor controlled.

Thereafter, standard photolithography techniques were used to define the finger grid for the top and third electrode. Shipley AZ 1350J resist and Shipley recipes were used. The top grid was fabricated by first evaporating an 88 wt. % Au-12 wt. % Ge alloy film 0.3 μm thick and then plating Au to build up the grid thickness to 2 μm. The Au:Ge alloy was purchased from Cominco American and the Au plating solution was purchased from Sel-Rex.

Standard photolithography was used with a second mask pattern to fabricate the grooves for the third electrode. The grooves were etched into the P-type layer of GaAsP. The grooves were interdigitated with the top grid. The same mask also defined the perimeter of the top cell. The GaAsP was etched with an NH$_4$OH:H$_2$O$_2$:H$_2$O (20:7:1000) solution for 40 minutes. The etch rate was 0.1 μm/minute and the groove depth was 4 μm.

Further, known photolithography was used with a third mask pattern to allow the P-type layer grid fabrication. Au:Be was evaporated first and then the grid thickness was increased by Au platting as described for the top electrode. At this point, both grids were alloyed to the semiconductor by heat treatment in a tube furnace with flowing N$_2$ for 20 minutes at 300° C.

Additional known photolithography was used with a fourth pattern to define the bottom cell electrode mesa. Etching was done with an H$_2$SO$_4$:H$_2$O$_2$:H$_2$O (10:1:1) solution for 10 minutes (etch rate 0.4 μm/minute). An alternative etch has also been used, i.e., HBr:Br$_2$:H$_2$O (17:1:300).

Thereafter, the top layer was thinned with a 5 minute etch using the NH$_4$OH:H$_2$O$_2$:H$_2$O etch described above and an antireflection coating of Ta$_2$O$_5$ film 800 Angstroms thick was E-beam evaporated. Photolithography was used to protect the contact pads during Ta$_2$O$_5$ deposition. Wires were connected to the three electrodes and the solar cell was illuminated with an intensity of 40 suns. The GaAsP cell had an open circuit voltage ($V_{oc}$) of about 1 volt, a fill factor (F.F.) of about 0.75, a short circuit current ($I_{sc}$) of about 11.4 mA/cm$^2$ corrected to 1 sun, and an efficiency of 11.4%. The GaAsSb cell had a $V_{oc}$ of 0.75 volt, $I_{sc}$ of 6.8 mA/cm$^2$, F.F. of 0.75, and an efficiency of about 5.1%. The total efficiency of the device was 16.5%.

What is claimed is:

1. A three-terminal two-color solar cell comprising:
   a conductive substrate;
   a layer of GaAs$_{1-y}$Sb$_y$ having regions of differing conductivity forming a homojunction therein contacting said substrate and lattice matching the substrate to within about ±1%;
   a transition layer of GaAs contacting the surface of said GaAsSb layer opposite to the surface contacting said substrate;
   a layer of GaAs$_{1-x}$P$_x$ having regions of differing conductivity forming a homojunction therein and having a larger bandgap than said GaAsSb layer, said GaAsP layer contacting the surface of said transition layer opposite to said surface contacting said GaAsSb layer; and
   means forming electrical contacts to said substrate, the incident surface of said GaAsP layer and the GaAsP region below the homojunction in said layer.

2. The solar cell according to claim 1 wherein y has the value of from about 0.1 to about 0.4 and x has the value of from about 0.1 to about 0.3.

3. The solar cell according to claim 2 wherein x and y are about 0.2.

4. The solar cell according to claim 1 wherein said transition layer is an N$^+$-type GaAs layer.

5. The solar cell according to claim 1 wherein said transition layer is a P$^+$-type GaAs layer.

6. The solar cell according to claim 1, 3, 4, or 5 wherein the GaAsSb layer has a handgap of about 1.1 eV and the GaAsP layer has a bandgap of about 1.65 eV.

7. A process of fabricating a three-terminal two-color solar cell comprising:
   mounting a conductive substrate in a chemical vapor deposition apparatus;
   evacuating said apparatus to a pressure of from about 1×10$^{-6}$ torr to about 1×10$^{-8}$ torr;
   heating said substrate to a temperature of from about 500° C. to about 650° C.;
   establishing a flow rate of an arsenic containing compound;
   establishing a flow rate of a gallium containing compound;
   adjusting the flow rates of said arsenic containing compound, an antimony containing compound and N-type and P-type dopants so as to grow a layer of GaAs$_{1-y}$Sb$_y$ on said substrate, said layer having regions of opposite conductivity type and forming a homojunction therein;
   terminating the flow of said antimony containing compound;
   adjusting the flow rate of said arsenic and N-type or P-type dopants so as to grow a transition layer of GaAs on said GaAs$_{1-y}$Sb$_y$ layer, said transition layer having the same conductivity as the light incident region of said GaAs$_{1-y}$Sb$_y$ layer;

decreasing the flow of said arsenic containing compound and introducing a phosphorus containing compound while varying the N-type and P-type dopants so as to grow an incident $GaAs_{1-x}P_x$ layer on said transition layer, said layer having regions of opposite conductivity type and forming a homojunction therein, said region contacting said transition layer having the same conductivity type as said transition layer;

terminating the flow of said gallium containing compound, said arsenic containing compound, said phosphorus containing compound, and said N-type and P-type dopants; and removing said substrate from said apparatus; and fabricating three electrodes to the solar cell wherein a first and a second electrode contact the substrate and the incident surface of the incident homojunction layer, respectively, and the third electrode contacts the incident homojunction layer below the homojunction therein.

8. The solar cell fabricated according to the method of claim 7.

* * * * *

UNITED STATES PATENT AND TRADEMARK OFFICE
CERTIFICATE OF CORRECTION

PATENT NO. : U.S. 4,451,691
DATED : May 29, 1984
INVENTOR(S) : Lewis M. Fraas

It is certified that error appears in the above-identified patent and that said Letters Patent are hereby corrected as shown below:

Col. 12, Claim 6, Line 2, "handgap" should read --bandgap--.

Signed and Sealed this

Sixth Day of November 1984

[SEAL]

Attest:

GERALD J. MOSSINGHOFF

Attesting Officer

Commissioner of Patents and Trademarks